(12) United States Patent
Bourgault et al.

(10) Patent No.: US 6,667,623 B2
(45) Date of Patent: Dec. 23, 2003

(54) LIGHT DEGRADATION SENSING LED SIGNAL WITH VISIBLE FAULT MODE

(75) Inventors: Jean-Simon Bourgault, Montreal (CA); Claude Boisvert, Brossard (CA)

(73) Assignee: Gelcore LLC, Valley View, OH (US)

( * ) Notice: Subject to any disclaimer, the term of this patent is extended or adjusted under 35 U.S.C. 154(b) by 96 days.

(21) Appl. No.: 10/039,407

(22) Filed: Nov. 7, 2001

(65) Prior Publication Data

US 2003/0085710 A1 May 8, 2003

(51) Int. Cl.[7] .............................. G01R 3/00; G08G 1/095
(52) U.S. Cl. ................... 324/414; 340/907; 340/815.45
(58) Field of Search ...................... 324/414; 362/800; 340/815.45, 907, 463

(56) References Cited

U.S. PATENT DOCUMENTS

| | | | | |
|---|---|---|---|---|
| 5,663,719 A | * | 9/1997 | Deese et al. ............... | 340/912 |
| 6,019,493 A | * | 2/2000 | Kuo et al. ................... | 362/335 |
| 6,283,613 B1 | * | 9/2001 | Schaffer ...................... | 362/245 |
| 6,509,840 B2 | * | 1/2003 | Martineau ................... | 340/815.45 |
| 2002/0089420 A1 | * | 7/2002 | Martineau et al. .......... | 340/463 |

\* cited by examiner

*Primary Examiner*—N. Le
*Assistant Examiner*—Timothy J. Dole
(74) *Attorney, Agent, or Firm*—Orum & Roth

(57) ABSTRACT

A light emitting diode (LED) signal with an LED light output monitoring sensor. If the LED light output drops below a pre-set level, an output signal of the sensor via a comparator and deactivation circuit, deactivates one or more LEDs creating a visible fault display aspect, thereby visually indicating signal failure but allowing a continued use of the signal prior to replacement.

15 Claims, 5 Drawing Sheets

LIGHT DEGRADATION SENSING LED SIGNAL WITH VISIBLE FAULT MODE

BACKGROUND OF THE INVENTION

1. Field of the Invention

The present invention relates to signals, in particular, Light Emitting Diode (LED) Signals. More specifically, the present invention relates to an LED traffic signal having a LED light output degradation sensing circuit that activates a visible fault mode.

2. Description of the Related Art

LED traffic signals present numerous advantages over common incandescent lamp traffic signals. Use of LED's provides a power consumption savings and extremely long life in comparison to common incandescent light sources. The long life span creates improved reliability and sharply lowered maintenance costs.

LED signals have an extremely long service life that has increased with each new generation of LEDs. Incandescent lamps, while having a much shorter service life, have relatively constant light output until a total failure occurs, i.e. burnout of the light filament. LED signals, over an extended period, have gradually diminishing light output. Further, LED light output is negatively affected by temperature. In extreme climate or during unnaturally warm periods LED light output diminishes during the day and then returns to a normal level during cooler periods at night.

Because of the difficulty, time and expense of accurately determining when an LED signal has permanently dropped below the acceptable light output limit, it is customary for consumers to automatically replace LED signals upon expiration of the warranty (for example, five years). This may result in years of useful service life being unnecessarily wasted, reducing the cost effectiveness of using LED signals.

U.S. patent application Ser. No. 09/543,240, assigned to Gelcore LLC, incorporated herein by reference, discloses monitoring circuits for an LED signal that shut off the signal if the power supply or LED arrays change their voltage and/or current characteristics. Unfortunately, LED light output may degrade without a change in the LED signal's voltage or current characteristics.

U.S. patent application Ser. No. 09/827,429, assigned to Gelcore LLC, filed Apr. 6, 2001, incorporated herein by reference, discloses light output monitoring circuits for an LED signal which disables the signal when a low light output threshold has been reached. Unfortunately, disabling an LED signal, for example a traffic signal, can have an extremely disruptive effect that will last until materials and personnel become available and the failed signal is replaced.

Therefore, the present invention has the objective of providing a cost effective and automatic means for detecting when an LED signal's light output has fallen below an acceptable level, and then initiating a visible failure mode while still continuing to operate.

Further objects will be realized by one skilled in the art, through review of the following description and appended claims.

SUMMARY OF THE INVENTION

A light sensor, mounted within an LED signal housing, senses a light output level. When the light level falls below a preset level, a short circuit is created that disables a selected group of LEDs. The disabled LEDs creating an altered display aspect that alerts users that replacement is necessary, but permits signal operation until replacement occurs.

DETAILED DESCRIPTION

Figure 1:
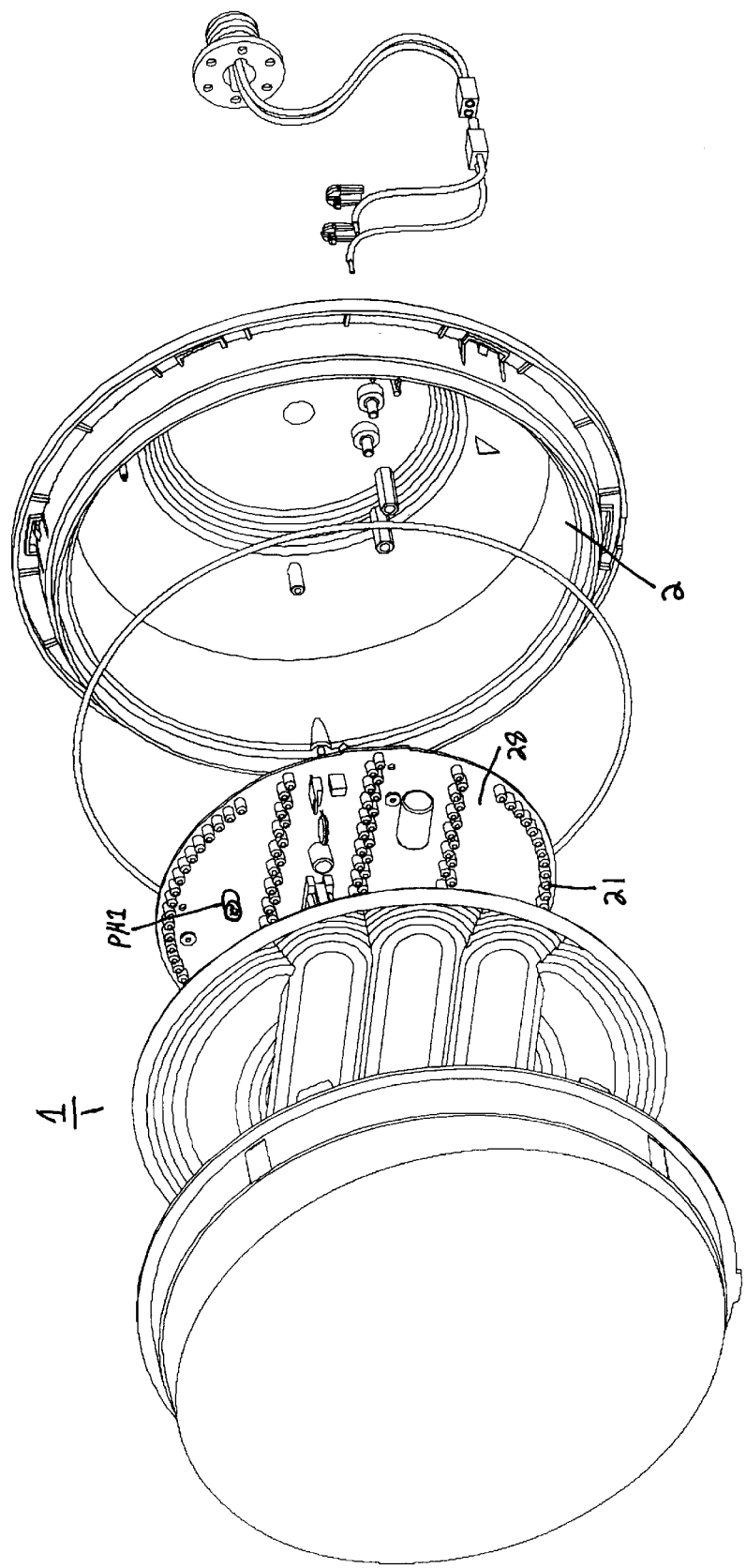
FIG. 1 is an exploded view of an LED signal.

FIG. 1 shows an exploded view of an energy efficient LED signal 1 designed to retrofit into an existing signal housing originally designed for an incandescent light source. The LED signal 1 has a plurality of LED(s) 21 mounted in the signal on a PCB 28 which also carries the electrical components comprising the signal's power supply and visual failure mode circuitry.

A light sensor PH1 is mounted in the LED signal 1 on the PCB 28. The light sensor PH1 may be, for example, a photo diode, a photo transistor, a photo cell or other device capable of outputting a signal with respect to the light level sensed. Light sensor PH1 is an input for a comparator circuit which, for example, may compare the input to a reference voltage. If the input does not exceed the preset level, a disabling/deactivating function is initiated, for example short circuit across a selected group of LEDs, causing the signal display aspect to change, indicating failure of the signal but still allowing the signal's operation until it is replaced. Where the light sensor PH1 is a photo transistor, a common voltage comparator circuit may be used. The reference voltage, set by selection of a resistor in the voltage comparator circuit, determines the light level at which the LED short circuit will be initiated. The short circuit may be created by, for example, a MosFET switch which closes a transistor.

Figure 2:
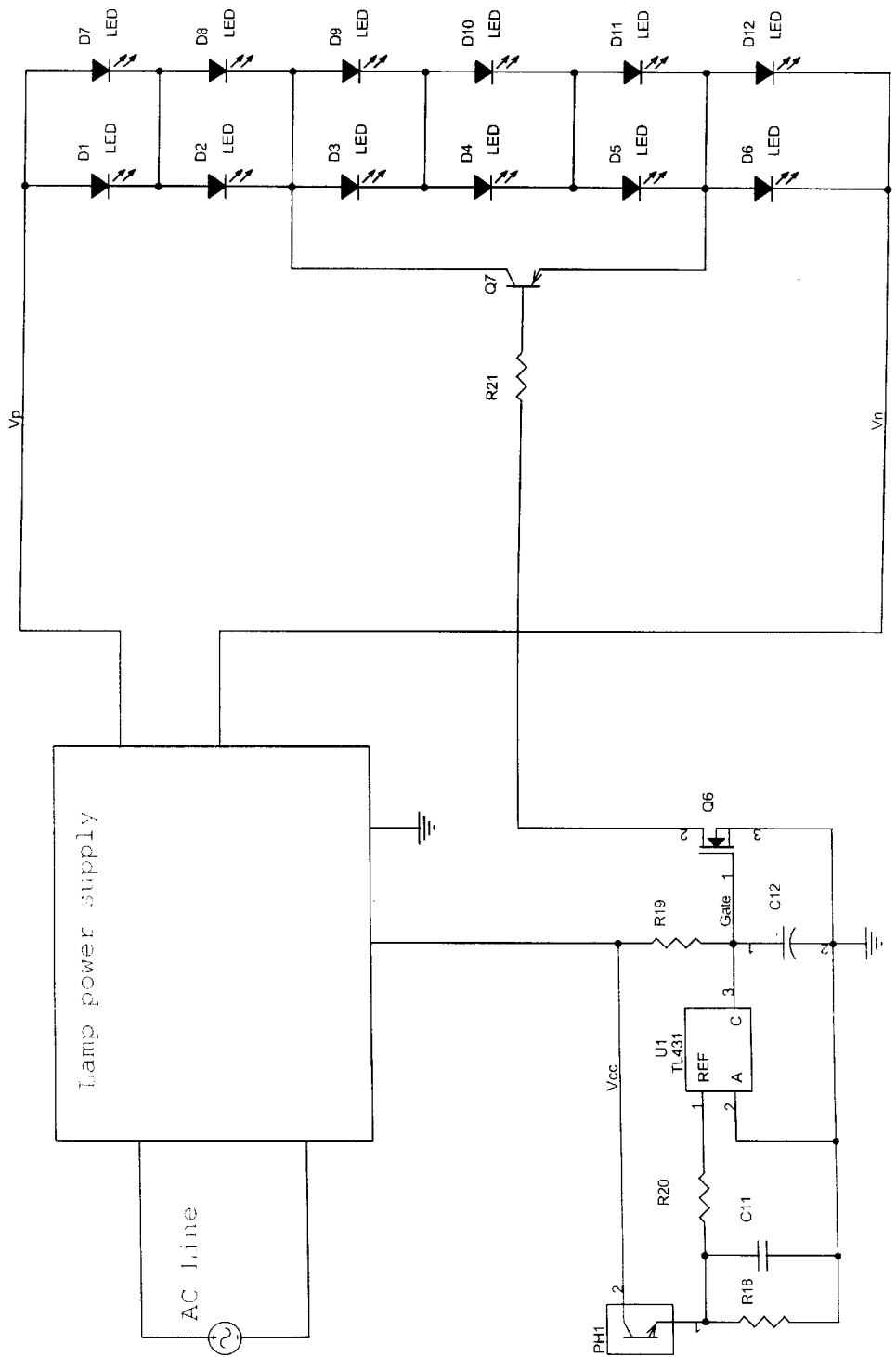
FIG. 2 is an electrical schematic of one embodiment of LED light degradation sensor circuitry.

One embodiment of the electrical circuitry is shown in FIG. 2. Light sensed by a photo transistor PH1 creates a proportional current output which, transformed by resistor R18 and filtered by capacitor C11 is seen as a voltage level input passed through current limiting resistor R20 to the REF pin of comparator integrated circuit U1, for example a TL431 adjustable precision shunt regulator. The selected value of resistor R18 sets the voltage level proportional to the desired light level which the comparator circuit U1 will compare to its internal reference voltage. As the LED light output degrades over time, PH1 senses less and less light, lowering its output. When the voltage at the U1 Ref Pin falls below the U1 internal voltage, U1 opens the short circuit between pins A and C causing the Q6 gate to go high, closing MosFET Q6. In normal operation, LED light in the housing will be sensed by PH1 creating an output high enough so that the voltage at the U1 Ref pin is higher than the U1 internal reference voltage. As long as the U1 Ref Pin is at a higher voltage than the U1 internal reference voltage, U1 pins A and C will be shorted causing the Q6 gate to be grounded, which in turn maintains Q6 in a blocked state. An RC network comprising resistor R19 and capacitor C12 provides a transient suppression effect to prevent a false energized state in the Q6 gate from momentarily occurring and falsely causing a disabling short circuit.

Figure 4:
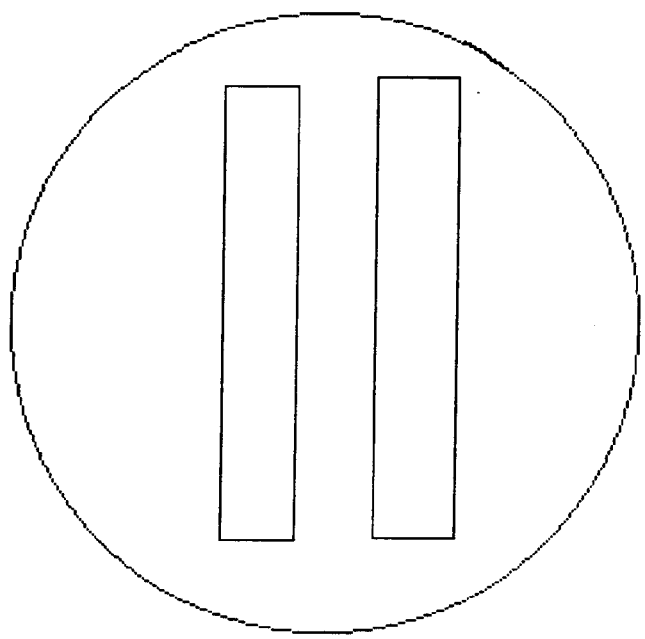
FIG. 4 is another example of an LED signal display aspect in visible failure mode.
Figure 3:
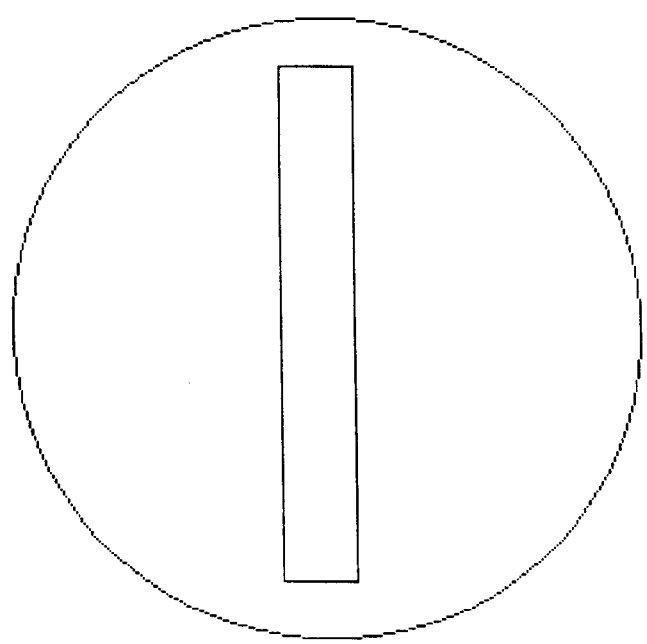
FIG. 3 is an example of an LED signal display aspect in visible failure mode.
Figure 6:
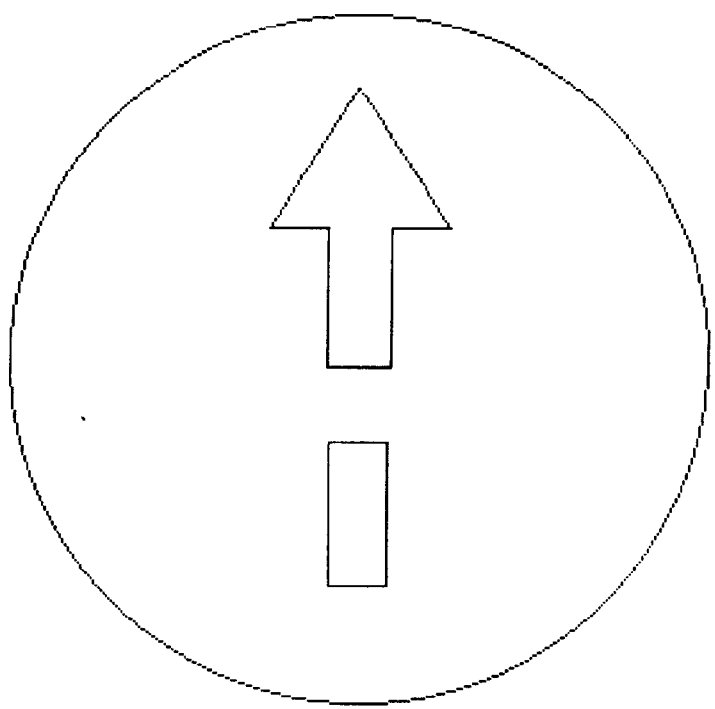
FIG. 6 is an example of an LED turn signal display aspect in visible failure mode.
Figure 5:
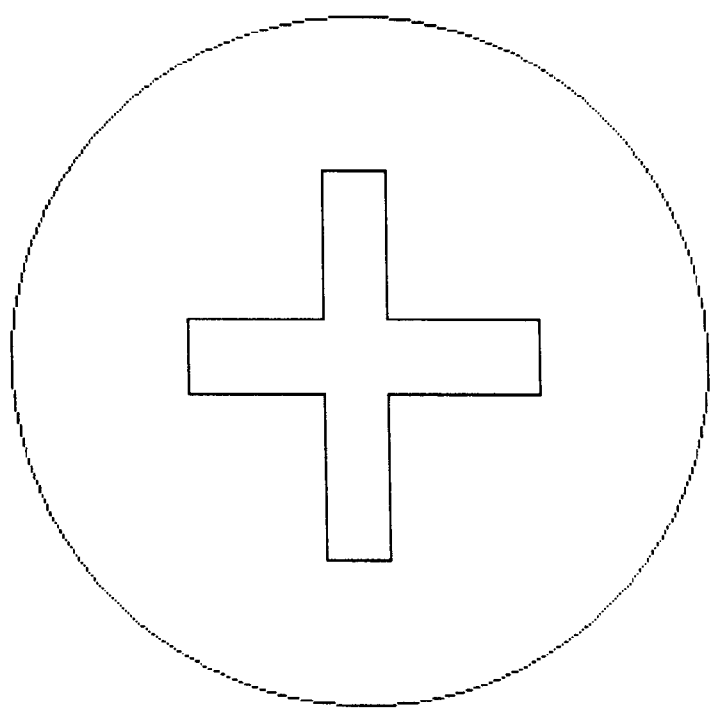
FIG. 5 is another example of an LED signal display aspect in visible failure mode.
Figure 7:
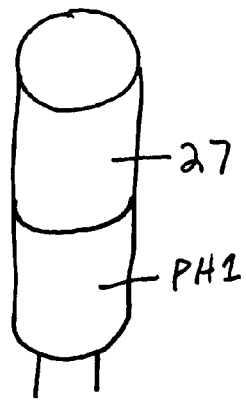
FIG. 7 is an isometric view of a light sensor baffle.
Figure 8:
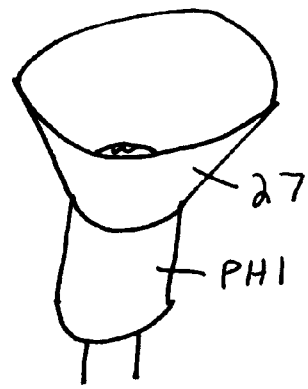
FIG. 8 is an isometric view of another embodiment of a light sensor baffle.
Figure 9:
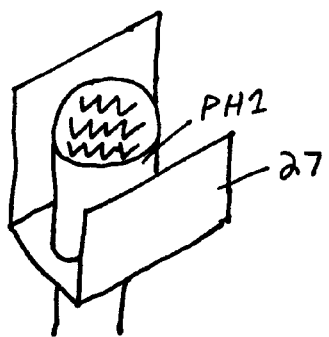
FIG. 9 is an isometric view of another embodiment of a light sensor baffle.
Figure 10:
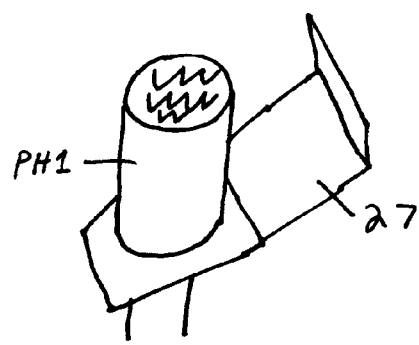
FIG. 10 is an isometric view of another embodiment of a light sensor baffle.

When Q6 is closed Q7, a PNP transistor for example type MPSA56, closes, creating a short circuit across a selected group of LEDs 21 (D3–D5, D9–D11) establishing a bias current into Q7. The shorted LEDs are selected to cause a visible change in the display aspect. For example as shown in FIGS. 3–5, the center polygon(s) are darkened areas of the LED signals display aspect, thereby visually indicating the failure mode of the LED signal. FIG. 6 shows a directional arrow signal display aspect, interrupted in the middle to indicate a failure mode.

To ensure that the light sensor PH1 is reading the aggregate light output level of the LED signal and not just the output of the closest LED(s) 21 a baffle, shroud or blinder 27 as shown in FIGS. 7–10 may be used so that the light sensed is a reflection off of the optical elements and/or the housing 2 side walls and not dependent just on the output of the closest LED(s) 21. Alternately, a light sensor PH1 with a high open/large viewing angle may be used.

The present invention may be used with any form of signals, displays, illumination or control circuits utilizing LED's as a light source that requires monitoring for light output degradation, the degradation indicated by a visual failure mode.

When used with an LED signal with the LEDs close to the outer cover, it may not be possible to locate the light sensor PH1 where it can sense the aggregate light output of all the LEDs. In this case, the light sensor PH1 may be located between a representative group of the LEDs and the reference voltage adjusted accordingly.

The light sensor is in operation whenever the LED signal is energized. During daylight use, external light levels may influence the light sensor PH1 into a false reading that LED 1 output levels are normal even though they have in actuality degraded below the acceptable level. This is not a problem as the degradation in output levels occurs over a period of years. As the cut-off level approaches, a difference of an additional 12 hours (for night time or other transient interruption of the external light to occur) is immaterial. A capacitor, resistor combination or other timed delay can be used to create a known delay period during which the input must be below the reference level or the circuit will reset and be forced to pass through the entire delay period again before triggering the visual failure mode. This feature prevents line voltage transients or extreme heat that may temporarily lower light output or create a false output at the MosFET Q6 from activating the visual failure mode.

Further, although particular components and materials are specifically identified herein, one skilled in the art may readily substitute components and/or materials of similar function without departing from the invention as defined in the appended claims.

The present invention is entitled to a range of equivalents, and is to be limited only by the following claims.

We claim:

1. An LED signal with a visual failure mode comprising:

a housing having an interior area, a plurality of LEDs, a light sensing means, a comparator means, and a disablement means;

the plurality of LEDs arranged and configured within said interior area of said housing;

the light sensing means located within the interior area of the housing, having an output value relative to a light level within the housing;

the comparator means comparing the output value to a reference value;

the comparator initiates the disablement means which deactivates at least one of the LEDs if the output value is below the reference value.

2. The LED signal of claim 1, wherein:

the light sensing means is a phototransistor.

3. The LED signal of claim 1, wherein:

the comparator means is a voltage comparator circuit.

4. The LED signal of claim 1, wherein:

the disablement means is a transistor switch that creates a short circuit across the LED(s) to be deactivated.

5. The LED signal of claim 1, further including:

a time delay circuit the time delaying circuit delaying the initiation by the comparator means of the disablement means.

6. An apparatus for detecting LED light degradation and initiating a visible failure mode comprising:

a light sensing means for detecting an output level of at least one LED(s), a comparator means, and a disablement means;

the light sensing means having an output value relative to a light level emitted by the LED(s);

the comparator means comparing the output value to a reference value, representing a degradation light output level;

if the output value is below the reference value the comparator initiates the disablement means, deactivating at least one of the LED(s).

7. The Apparatus of claim 6, wherein:

the light sensing means is a phototransistor.

8. The Apparatus of claim 6, wherein:

the comparator means is a voltage comparator circuit.

9. The Apparatus of claim 6, wherein:

the disablement means is a transistor switch that creates a short circuit across the LED(s) to be deactivated.

10. The apparatus of claim 6, further including:

a time delay circuit the time delaying circuit delaying the initiation by the comparator means of the disablement means.

11. A method for creating a visual failure mode in an LED light source with a plurality of LEDs, comprising the steps of:

sensing a light output of the LED light source;

comparing the light output to a reference; and de-activating at least one of the LEDs if the light output is less than the reference.

12. The method of claim 11 wherein the at least one LED(s) are de-activated by the step of activating a switch that creates a short circuit across the at least one LED(s).

13. The method of claim 11 further including the step of requiring the light output to be less than the reference for a delay period prior to the step of de-activating at least one of the LED(s).

14. An apparatus for detecting a LED light degradation output and initiating a visual failure mode in an LED signal with a plurality of LEDs comprising:

a light sensor, a comparator, and a switch;

the light sensor sensing an LED light output level and outputting an electrical signal proportional to the LED light output level, the comparator comparing the electrical signal to a reference electrical signal and operating the switch if the electrical signal is below the reference electrical signal, the switch de-activating at least one of the plurality of LEDs.

15. The apparatus of claim 14 further including:

a time delay circuit, the time delay circuit delay operation of the switch by the comparator.

* * * * *